United States Patent

[11] 3,628,963

[72] Inventors Kiyoshi Akamatsu;
Takeaki Hagihara; Teruhisa Ishido, all of Tokyo, Japan
[21] Appl. No. 772,036
[22] Filed Oct. 30, 1968
[45] Patented Dec. 21, 1971
[73] Assignee Asahi Kasei Kogyo Kabushiki Kaisha
Osaka, Japan
[32] Priority Nov. 9, 1967
[33] Japan
[31] 42/71704

[54] PHOTOSENSITIVE COMPOSITIONS
7 Claims, No Drawings

[52] U.S. Cl. .......... 96/115 R, 96/115 P, 204/159.16, 204/159.19
[51] Int. Cl. .......... G03c 1/68, G03c 1/70
[50] Field of Search .......... 96/115 P, 115 R; 204/159.16, 159.19

[56] References Cited
UNITED STATES PATENTS

| | | | |
|---|---|---|---|
| 2,791,504 | 5/1957 | Plambeck | 96/115 P |
| 3,136,638 | 6/1964 | Schwerin et al. | 204/159.15 X |

*Primary Examiner*—William D. Martin
*Assistant Examiner*—D. Cohen
*Attorney*—Burgess, Dinklage & Sprung

ABSTRACT: The photosensitive compositions comprising (A) an unsaturated polyester, (B) acrylic acid and (C) a photopolymerization initiator, said unsaturated polyester being produced from an alcoholic component comprising at least one etherdiol having one to four ether-oxygen groups in the main chain and an acidic component comprising at least one unsaturated dicarboxylic acid, anhydride or dimethyl or diethyl ester thereof and having an average molecular weight of 1,500 to 50,000 and a double bond concentration of $1\times10^{-2}$ to $2\times10^{-4}$ mole/g., the amount of (B) acrylic acid being 10 to 80 percent by weight of the total amount of the photosensitive composition and the amount of the photopolymerization initiator being 0.001 to 10 percent by weight of the total amount of the photosensitive composition.

PHOTOSENSITIVE COMPOSITIONS

This invention relates to novel photosensitive compositions photopolymerizable by the action of actinic light and more particularly to photosensitive compositions comprising an unsaturated polyester, at least one addition polymerizable or ring-openable ethylenically unsaturated compound and a photopolymerization initiator.

Photopolymerizable compositions are valuable for manufacturing printing plates, matrices of printing plates, molds for ceramics, casting or molding plastics or reliefs for displays. These articles are easily produced by exposing a layer of photosensitive compositions to actinic light through an image-bearing transparency and then washing off an unexposed areas with a solvent.

It is known that the silver salts in photography and thermoreactive resins in infrared baking and coating utilize the reaction by actinic light in an industrial scale. There are known chrome-containing polyvinylalcohols and polyvinylalcohol cinnamates similar to these compounds in manufacturing printing plates but they only give a thin photocrosslinked layer of less than 0.1 mm. in thickness and it is impossible to produce thick plates or high relief articles. The articles prepared by photopolymerizing a mixture of a cellulose material and a divinyl compound of a relatively low molecular weight having a terminated unsaturated group suffer from an insufficient hardness, strength and solvent resistance Dicryl (trade name by E. I. Du Pont de Nemours & Co.) has a limited range of hardness and is fragile and deteriorated by humidity, water and especially aqueous alkali solutions. Nyloprint (trade name by Badische Anilin & Soda Fabrik) using soluble nylons has an inferior resistance for alcoholic solvents and weather resistance. These photosensitive compositions are coated in a regular thickness on a metal support and only used in producing printing plates.

The present invention is to provide useful liquid photosensitive compositions applicable to any field which avoid the prior art disadvantages.

The object of this invention is to provide such photosensitive compositions that are soluble in water and aqueous solutions and have a good resolubility and developability, and that are photopolymerized under the influence of actinic light to easily produce photopolymerized articles having precise and clear reliefs and a superior water resistance, solvent resistance, tensile strength, elongation, transparency and any hardness.

According to this invention there have been provided photosensitive compositions comprising (A) an unsaturated polyester, (B) acrylic acid and (C) a photopolymerization initiator, said unsaturated polyester being produced from an alcoholic component comprising at least one etherdiol having one to four ether-oxygen groups in the main chain and an acidic component comprising at least one unsaturated dicarboxylic acid, anhydride or dimethyl or diethyl ester thereof and having an average molecular weight of 1,500 to 50,000 and a double bond concentration of $1\times10^{-2}$ to $2\times10^{-4}$ mole/g., the amount of (B) acrylic acid being 10 to 80 percent by weight of the total amount of the photosensitive composition and the amount of the photopolymerization initiator being 0.001 to 10 percent by weight of the total amount of the photosensitive composition. In order to increase a resolubility and a developability of the photosensitive compositions, the use of an alcoholic component having a higher molecular weight in producing an unsaturated polyester is insufficient, but it is preferable to increase a concentration of a polar group such as ether, ester or hydroxy group in the unsaturated polyester and the use of an etherdiol having five or more ether-oxygen groups in the main chain as the alcoholic component gives an inferior water resistance and tensile strength to the photopolymerized articles. Also when an alklenediol is used as the alcoholic component, the organic solvent resistance of the photopolymerized articles are inferior. On the other hand, an unsaturated polyester derived from an alcoholic component comprising at least one etherdiol having one to four ether-oxygen groups exhibits an excellent resolubility, developability prior to photopolymerization water resistance and organic solvent resistance after photopolymerization.

The etherdiols utilized for the preparation of an unsaturated polyester are polyoxyethleneglycols of the formula, $$HO-(CH_2-CH_2-O)_n-H$$

wherein *n* is an integer from 2 to 5, polyoxypropyleneglycols of the formula, $$HO-(CH_2-\underset{\displaystyle CH_3}{\underset{|}{C}}H-O)_n-H$$

wherein *n* is 2 to 5, polyoxytrimethyleneglycols of the formula, $$HO-(CH_2-CH_2-CH_2-O)_n-H$$

wherein *n* is 2 to 5, polyoxytetramethyleneglycol of the formula, $$HO-(CH_2-CH_2-CH_2-CH_2-O)_n-H$$

wherein *n* is 2 to 5, poly-2-methyloxybutandiol of the formula, $$HO-(CH_2-\underset{\displaystyle CH_3}{\underset{|}{C}}H-CH_2-CH_2-O)_n-H,$$

glycerin-propyl etherdiol monoacetate, glycerinpropylethertriol monolaurate, trimethylolpropane-propylethertriol monopropionate and trimethylolpropane-propylethertriol monooleate.

Examples of suitable polyols which may be used for modifying the unsaturated polyesters are ethyleneglycol, propyleneglycol, neopentylglycol, trimethyleneglycol, tetramethyleneglycol, pentamethyleneglycol, hexamethyleneglycol, glycerine monooleate, trimethylolpropane monooleate, glycerol, trimethylolpropane, erythritol, pentaerythriotol, pentitol, bis-(hydroxyethyl)terephthalate, bis-(hydroxyethyl)phthalate, bis-(hydroxypropyl)terephthalate.

Exemplary unsaturated dicarboxylic acids, anhydrides, and dimethyl or diethyl esters thereof utilized for the preparation of an unsaturated polyester include maleic acid, maleic anhydride, dimethyl maleate, diethyl maleate, fumaric acid, dimethyl fumarate, diethyl fumarate, chloromaleic acid, citraconic acid, citraconic anhydride, methaconic acid, itaconic acid, muconic acid, glutaconic acid and aconitic acid.

In order to improve the tensile strength, hardness, solvent resistance, abrasion resistance, impact resistance and flexibility of the photopolymerized articles, a part of the unsaturated dicarboxylic acids, anhydrides or methyl or ethyl esters may be substituted with a carboxylic acid, anhydrides or methyl or ethyl esters thereof to vary a double bond concentration in an unsaturated polyester. The term "double bond concentration" means the mole concentration of double bond per 1 g. of an unsaturated polyester. The double bond concentration is preferably in the range of $1\times10^{-2}$ to $2\times10^{-4}$ mole/g. When the double bond concentration is above $1\times10^{-2}$ mole/g. the hardness becomes so great that the photopolymerized articles exhibit substantially neither flexibility nor impact resistance. On the other hand when the double bond concentration is below $2\times10^{-4}$ mole/g., the photopolymerization only proceeds to such an extent as to give a photopolymerized article having a poor resolubility and solvent resistance, which is of no use for practical purposes.

Such carboxylic acids, anhydrides and methyl or ethyl esters thereof which can be used for modifying an unsaturated polyester, include succinic acid, glutaric acid, adipic acid, pimelic acid, phthalic acid, isophthalic acid, terephthalic acid, dimethylesters, diethylesters thereof, phthalic anhydride, palmitic acid, stearic acid, oleic acid, linolic acid and linolenic acid.

(A) An unsaturated polyester, i.e., the first component of the present photosensitive compositions can be produced by a conventional process. Usually an unsaturated polyester is formed by direct esterification, ester exchange or addition reaction between (a) an etherdiol, if desired, modifying agent such as polyols and (b) an unsaturated dicarboxylic acid and/or its anhydride and/or its dimethyl or diethyl ester, if desired, modifying agents such as carboxylic acids, anhydrides or methyl or ethyl esters thereof.

It is preferred to use the unsaturated polyesters having an average molecular weight of from 1,500 to 50,000. When the average molecular weight of the unsaturated polyesters is below 1,500, the flexibility after photopolymerization is not sufficient. On the other hand the preparation of unsaturated polyesters having an average molecular weight above 50,000 becomes difficult and a developability of the photosensitive compositions comprising such unsaturated polyesters is extremely poor, not giving clear and precise patterns.

As the second component of the present photosensitive composition, the most preferable addition polymerizable ethylenically unsaturated compound is (B) acrylic acid. Firstly, acrylic acid improves remarkably the rate of photopolymerization and secondly, may give the desired hardness to the photosensitive composition after photopolymerization by varying the amount of acrylic acid. Thirdly, acrylic acid gives a superior resolubility to the photosensitive compositions and fourthly, improves greatly the tensile strength of the photosensitive compositions after photopolymerization. Fifthly, owing for its affinity to water, acrylic acid improves the dispersibility of the unsaturated polyesters in water which makes it possible to develop the photosensitive compositions with an aqueous solution and sixthly, gives a good transparency to the photosensitive compositions after polymerization owing to its affinity for the unsaturated polyesters.

It is preferred to employ acrylic acid in amounts of from 10 to 80 percent by weight based upon the total amount of the photosensitive composition. When the amount of acrylic acid is less than 10 percent by weight, the rate of photopolymerization is very slow and the mechanical strength after photopolymerization is too low for practical use. When said amount is more than 80 percent by weight, the photopolymerization does not fully proceed so as to exhibit the characteristics of the unsaturated polyesters as a frame for photopolymerization and the organic solvent resistance as well as the resolubility are unfavorably lowered.

It has been found that when (D) a compound of the formulas;

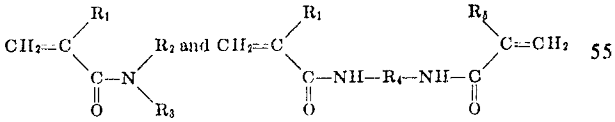

wherein $R_1$, $R_2$ and $R_5$ represent hydrogen atom or methyl group; $R_3$ represents hydrogen atom,$-C_mH_{2m+1}$ wherein $m$ is an integer from 1 to 6, cyclohexyl,$-(CH_2)_n-OH$ wherein $n$ is an integer from 1 to 5, $-(CH_2)_q-CH_3$ wherein $p$ is an integer of from 1 to 2 and $q$ is 0 or an integer from 1 to 5 or$-CH_2-CH=CH_2$; $R_4$ represents$-(CH_2)_r-$wherein $r$ is an integer from 1 to 10, is used together with acrylic acid, the tensile strength after photopolymerization may be markedly improved while maintaining the rate of photopolymerization of acrylic acid, and that the compounds as such has no compatibility with the unsaturated polyester.

Such compounds include, for example, acrylamide, methacrylamide, N,N-dimethylacrylamide, N-isopropylacrylamide, N-hexylacrylamide, N-cyclohexylacrylamide, N-methylolacrylamide, N-ethylolacrylamide, N-amylolacrylamide, N-allylacrylamide, N,N'-methylene bisacrylamide, N,N'-trimethylene bisacrylamide, N,N'-hexamethylenebisacrylamide, N,N'-decamethylenebisacrylamide, N-methoxyethylacrylamide, N-methylmethacrylamide, N-allylmethacrylamide, N-methylolmethacrylamide, N,N'-methylenebismethacrylamide and N-ethoxyethylmethacrylamide. Among these compounds acrylamide is most preferable for showing the above-mentioned effect. At most 75 percent by weight of acrylic acid may be preferably substituted by said compound. When the amount of said compound is more than 75 percent by weight, the compatibility with the unsaturated polyesters and acrylic acid is lost and the photopolymerization is hindered to greatly lower the tensile strength after photopolymerization.

It has also been found that when (E) a compound having at least one

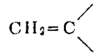

group and one benzene nucleus is used together with acrylic acid, the transparency and water resistance are remarkably increased.

Such compounds include, for example, styrene, divinylbenzene, alpha-methylstyrene, vinyltoluene, alpha-chlorostyrene, vinylchlorobenzene, vinylphenol, aminostyrene, vinylbenzoic acid, methoxystyrene, allylbenzene, diallylbenzene, monoallylphthalate and diallylphthalate. Among these compounds styrene and diallylphthlate are most preferable for showing the above-mentioned effects. At most 90 percent by weight of acrylic acid may be preferably substituted by said compound. When the amount of said compound is more than 90 percent by weight, the water dispersibility of the photosensitive compositions becomes worse and consequently the development with an aqueous solution is difficult. The tensile strength after photopolymerization is too low for practical use.

Furthermore, it has been found that when (F) a compound of the formulas;

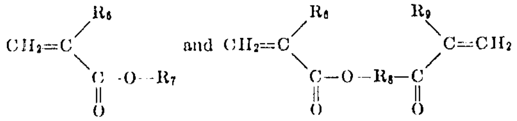

wherein $R_6$ and $R_9$ represent hydrogen atom, chlorine atom or methyl; $R_7$ represents hydrogen atom, $-C_mH_{2m+1}$ wherein $m$ is an integer from 1 to 15,

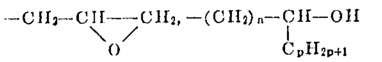

wherein $n$ is an integer from 1 to 2 and $p$ is an integer from 1 to 5,

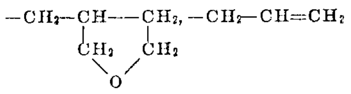

or $-(CH_2-CH_2-O)_q-H$, wherein $q$ is an integer from 1 to 15 and $R_8$ represents $-(CH_2-CH_2-O)_r-$wherein $r$ is an integer from 1 to 15, is used together with acrylic acid, the elongation after photopolymerization is increased and consequently an excellent flexibility is afforded.

Such compounds include, for example, methylacrylate, ethylacrylate, methylalphachloroacrylate, butylacrylate, isobutylacrylate, propylacrylate, 2-ethylhexylacrylate, n-octylacrylate, n-decylacrylate, n-tetradecylacrylate, allylacrylate, furfurylacrylate, glycidylacrylate, methacrylic acid, methylmethacrylate, butylmethacrylate, isobutylmethacrylate, 2-ethylhexylmethacrylate, laurylmethacrylate, furfurylmethacrylate, diethyleneglycol diacrylate, tetraethyleneglycol diacrylate, ethyleneglycolmonomethacrylate diethyleneglycolmonoacrylate, hexamethyleneglycoldimethacrylate, tetradecylethyleneglycoldimethacrylate, 2-hydroxyethylmethacrylate, 2-hydroxypropylmethacrylate, 2-hydroxyhexylmethacrylate and glycidylmethacrylate. Among these compounds methylacrylate and butylacrylate are most preferable. At most 90 percent by weight of acrylic acid may be preferably substituted by said compound. When the amount of said compound is more than 90 percent by weight, rate of photopolymerization is extremely retarded and a tensile strength after photopolymerization is lowered.

Still more to improve the properties of the photosensitive compositions before and after photopolymerization, two or three of said compounds (D), (E) and (F) may be used together with (B) acrylic acid at the same time. It is preferred to employ the third compound (E) or (F) in amounts of at most 80 percent by weight of the total amount of (B) acrylic acid and said compound (D) or (E) and to employ the fourth compound (F) in amounts of at most 70 percent by weight of the total amount of (B) acrylic acid and said compounds (D) and (E) for the exhibition of the aforementioned characteristics of said third or fourth compound to be added.

The unsaturated polyesters according to the present invention can be photopolymerized with the aforesaid ethylenically unsaturated compound with the use of a known photopolymerization initiator.

Examples of suitable such photopolymerization initiator include benzoins such as benzoin, alpha-methylbenzoin, benzoin methyl ether, benzoin ethyl ether, alphaphenylbenzoin, alpha-allylbenzoin; anthraquinones such as anthraquinone, chloroanthraquinone, methylanthraquinone, tert-butylanthraquinone; peroxides such as benzoyl peroxide, methylethylketone peroxide, potassium persulfate, disulfide such as diphenyl disulfide, tetraethylthiuram disulfide, diketones such as benzil, diacetyl; uranyl salts such as uranyl nitrate, uranyl propionate; 2-naphthalene sulfonyl chloride; metal halides such as silver chloride, silver bromide, stannic chloride, stannous chloride and titanium chloride.

These photopolymerization initiators are preferably used in proportion of 0.001 to 10 percent by weight based upon the total amount of the photosensitive composition. When the amount of the photopolymerization initiator is less than 0.001 percent by weight, the photopolymerization reaction is greatly retarded and is disadvantageous from the practical point. On the other hand when said amount is more than 10 percent by weight, the photosensitization is not fully intensified for its amount and is disadvantageous from the economical point.

Known stabilizers may be employed for the purpose of maintaining a storage stability and a better resolubility of the photosensitive compositions. Such stabilizers may be added when the components of a photosensitive composition are admixed or may be preliminarily added to each component prior to admixing the components.

Exemplary such stabilizers include hydroquinone, mono-tert-butyl hydroquinone, 2,5-di-tert-butyl hydroquinone, catechol, p-tert-butyl catechol, benzoquinone, 2,5-diphenyl-p-benzoquinone, pyridine, phenothiazine, p-diaminobenzene, beta-naphthol, naphthylamine, pyrogallol, cuprous chloride and nitrobenzene. These stabilizers are added only for completely preventing the dark reaction without restraining the photopolymerization reaction. Consequently the amount of the stabilizers is preferably varied from 0.005 to 3.0 percent by weight of the total amount of the photosensitive composition.

The present photosensitive compositions are readily photopolymerized by actinic light having wave lengths below 7,000 Angstroms, generally between 2,000 and 5,000 Angstroms. Practical sources of such actinic light include carbon arc lamps, super high-pressure mercury lamps, high-pressure mercury lamps, low-pressure mercury lamps, UV fluorescent lamps, xenon lamps and sunlight.

When the photosensitive compositions are exposed to actinic light at a distance of from about 5 cm. to about 100 cm through, for example, a photographic negative film, the image areas of the compositions are substantially photopolymerized in about 1 to 30 minutes to be rendered completely insoluble. The nonimage areas of the compositions may be washed out with water or an aqueous solution. Exemplary aqueous solutions include aqueous solutions of sodium hydroxide, potassium hydroxide, calcium hydroxide, ammonium hydroxide, sodium carbonate, sodium bicarbonate and potassium carbonate; mixture solutions of water with water soluble organic solvents such as methanol, ethanol, isopropanol, acetone, dioxane, tetrahydrofuran and phenol; and aqueous solutions of various kinds of surfactants.

The photosensitive compositions according to the present invention are especially useful for manufacturing various printing plates such as letterpress printing plates, gravure printing plates, high-etched offset printing plates, deep-etched printing plates, planography printing plates, name plates, memorial stamps, silk screens, screens for textile printing and process screens. Further, the photosensitive compositions are useful for manufacturing matrices of printing plates, molds for ceramics and molds for casting or molding plastics; and reliefs for display and indication applications, patterns and braille points.

This invention will be illustrated by the following examples which are in no way limiting upon the scope hereof. Parts are by weight unless expressly stated to the contrary.

EXAMPLE 1

Under an atmosphere of nitrogen gas, 0.25 mole of polyoxyethylene glycol having an average molecular weight of 200, 0.25 mole of dioxyethylene glycol, 0.23 mole of maleic acid and 0.27 mole of adipic acid were reacted at 180° C. for 6 hours to produce an unsaturated polyester having an average molecular weight of 10,000 and a double bond concentration of $1\times10^{-3}$ mole/g. To 100 parts of the unsaturated polyester thus obtained, there were added 0.1 part of hydroquinone, 60 parts of acrylic acid, 40 parts of styrene and 1 part of benzoin methylether and these were thoroughly mixed to produce a photosensitive composition.

To a glass cell consisting of a spacer of 10 mm. in height forming four sides of the cell, a bottom plate of a transparent glass, and a top plate of a transparent glass on which a negative film carrying a transparent image of a double eagle was tightly fixed, the aforesaid photosensitive composition was placed. The negative film side of the cell was exposed for 10 minutes to the light from a 3 kw. carbon arc lamp at a distance of 75 cm. The unexposed areas were removed by washing with a 20 percent aqueous acetone solution to give a plastic pattern of 10 mm. in thickness precisely and clearly corresponding to the image of the negative.

EXAMPLE 2

A variety of unsaturated polyesters shown in table I were prepared in the same manner as in example 1. To 100 parts of the unsaturated polyester, there were added 40 parts of acrylic acid, 2 parts of benzoin and 0.1 part of tert-butylcatechol and these were thoroughly mixed to produce a photosensitive composition. Each resulting photosensitive composition was exposed for 20 minutes to 60 w. fluorescent lamps for duplicate at a distance of 5 cm. and then a tensile strength, an elongation, a water absorption were measured. Also a water dispersibility of the photosensitive composition before photopolymerization was measured. The results are shown in table I.

TABLE I

| Example Number | Etherdiol (mole) | Unsaturated dicarboxylic acid (mole) | Double bond concentration (mole/gram) | Average molecular weight | Tensile strength [1] (kg./cm.²) | Elongation [2] | Water absorption [3] | Water dispersibility [4] |
|---|---|---|---|---|---|---|---|---|
| 2 | Ethyleneglycol, 0.50 | Maleic anhydride, 0.25, sebacic acid, 0.25. | $3\times10^{-3}$ | 2,200 | 140 | B | 2.0 | Separated. |
| 3 | Trioxyethyleneglycol 0.50 | do | $2\times10^{-3}$ | 7,500 | 120 | C | 2.3 | Good. |
| 4 | Polyoxyethyleneglycol (average molecular weight: 200), 0.50. | do | $2\times10^{-3}$ | 9,500 | 125 | C | 3.1 | Do. |
| 5 | Polyoxyethyleneglycol (average molecular weight: 1,000), 0.50. | do | $5\times10^{-4}$ | 15,200 | 30 | B | 83 | Do. |
| 6 | Polyoxyethyleneglycol (average molecular weight: 2,000), 0.50. | do | $2\times10^{-4}$ | 20,000 | 30 | B | 103 | Do. |
| 7 | Propyleneglycol, 0.50 | Maleic acid, 0.25; adipic acid, 0.25. | $3\times10^{-3}$ | 2,700 | 145 | C | 1.2 | Separated. |
| 8 | Trioxypropyleneglycol, 0.50 | do | $2\times10^{-3}$ | 5,400 | 145 | C | 1.9 | Good. |
| 9 | Polyoxypropyleneglycol (average molecular weight: 200), 0.50. | do | $2\times10^{-3}$ | 5,600 | 135 | C | 2.3 | Do. |
| 10 | Polyoxypropyleneglycol (average molecular weight: 1,000), 0.50. | do | $5\times10^{-4}$ | 13,000 | 65 | B | 33.2 | Do. |
| 11 | Polyoxypropyleneglycol (average molecular weight: 2,000), 0.50. | Maleic acid, 0.25; adipic acid, 0.25. | $2\times10^{-4}$ | 17,000 | 60 | B | 37.2 | Do. |
| 12 | Ethyleneglycol, 0.25; trioxypropyleneglycol, 0.25 | Maleic acid 0.25 Phthalic anhydride 0.25 | $5\times10^{-3}$ | 3,700 | 155 | C | 1.9 | Do. |
| 13 | Dioxyethyleneglycol, dioxypropyleneglycol, 0.25. | do | $2\times10^{-3}$ | 5,700 | 140 | C | 2.1 | Do. |

NOTE.—Conditions of measurement:
[1] Tensile strength: ASTM D638-58T.
[2] Elongation: ASTM D638-58T; A=0-50%, B=50-100%, C=100-200%, D=200-300%, E=>300%.
[3] Water absorption: ASTM D570-57T.
[4] Water dispersibility: After stirring for 10 minutes a 10% aqueous mixture solution of the photosensitive compositions by a homomixer.

EXAMPLES 14 to 38

0.25 mole of dioxypropylene glycol, 0.25 mole of polyoxyethylene having an average molecular weight of 200, 0.23 mole of fumaric acid and 0.27 mole of adipic acid were polycondensed in the same manner as in example 1 to obtain an unsaturated polyester having an average molecular weight of 9,000 and a double bond concentration of $1\times10^{-3}$ mole/g. To 100 parts of the unsaturated polyester thus obtained a desired amount of a variety of ethylenically unsaturated compounds shown in table II and 2 parts of benzoin were added and these were thoroughly mixed to give photosensitive compositions. Each resulting photosensitive compositions was exposed for 20 minutes to 60 w. fluorescent lamps at a distance of 10 cm. and then a tensile strength, a transparency, a water dispersibility and a gell up time were measured. The results are shown in table II.

TABLE II

| Example number | Ethylenically unsaturated compound | (Parts by weight) | Tensile strength [1] (kg./cm.²) | Transparency [2] | Water dispersibility [3] | Gell up time [4] |
|---|---|---|---|---|---|---|
| 14 | Acrylic acid | 25 | 90 | Transparent | Good | A |
| 15 | do | 50 | 140 | do | do | A |
| 16 | do | 100 | 410 | do | do | A |
| 17 | do | 200 | 780 | do | do | A |
| 18 | do | 300 | 1,340 | do | do | A |
| 19 | Methylacrylate | 100 | 20 | do | do | B |
| 20 | Butylacrylate | 100 | 5 | Translucent | Separated. | B |
| 21 | Trioxyethylene glycol diacrylate | 100 | 20 | do | Good | B |
| 22 | Methyl methacrylate | 100 | 35 | do | Separated. | C |
| 23 | Acrylamide | 50 | [5] | | | |
| 24 | N,N′-methylene-bis-acrylate | 50 | [5] | | | |
| 25 | Styrene | 100 | 19 | Transparent | Separated. | B |
| 26 | Diallylphthalate | 100 | 25 | do | do | B |
| 27 | Vinyltoluene | 100 | 7 | do | do | B |
| 28 | Vinyl benzoic acid | 100 | 23 | do | do | B |
| 29 | Vinyl acetate | 100 | 7 | Translucent | do | D |
| 30 | Vinyl chloroacetate | 100 | 4 | Translucent | do | D |
| 31 | Acrylonitrile | 100 | 12 | Opaque | do | C |
| 32 | 4-vinylpyridine | 100 | 2 | Discolored | do | D |
| 33 | Methylvinyl ketone | 100 | 5 | Translucent | Good | D |
| 34 | Methylvinyl ether | 100 | 4 | do | Separated. | D |
| 35 | Allyl alcohol | 100 | 5 | do | Good | C |
| 36 | Methylmaleate | 100 | 30 | Opaque | Separated. | C |
| 37 | N-vinylpyrolidone | 100 | 4 | Discolored | Good | D |
| 38 | 1-hexene | 100 | [6] | | | |

NOTE.—Conditions of measurements:
[1] Tensile strength: The same as in Examples 2-13.
[2] Transparency: Judged with the unaided eye.
[3] Water dispersibility: The same as in Examples 2-13.
[4] Gell up time: Time for the photopolymerization of the photosensitive composition of 5 mm. in thickness. A=0-5 minutes, B=5-50 minutes, C=50-100 minutes, D=>100 minutes.
[5] Incompatible.
[6] Not photopolymerized.

EXAMPLES 39 to 63

0.250 mole of ethylene glycol, 0.250 mole of diethylene glycol, 0.028 mole of glutaconic acid and 0.472 mole of succinic acid were polycondensed in the same manner as in example 1 to produce an unsaturated polyester having an average molecular weight of 7,000 and a double bond concentration of $3\times10^{-4}$ mole/g. To 100 parts of the unsaturated polyester thus obtained, there were added a desired amount of acrylic acid, a desired amount of a variety of ethylenically unsaturated compounds shown in table III and 2 parts of benzoin to produce photosensitive compositions. Each resulting photosensitive composition was exposed for 20 minutes to 60 w. fluorescent lamps at a distance of 5 cm. and then a tensile strength, an elongation, a transparency and a gell up time were measured. The results are shown in table III.

TABLE III

| Example Number | Ethylenically unsaturated compound | (Parts by weight) | Tensile strength [1] (kg./cm.²) | Elongation [2] | Transparency [3] | Gell up time [4] |
|---|---|---|---|---|---|---|
| 39 | Acrylic acid | 25 | 90 | C | Transparent | A |
| 40 | do | 38 | 115 | C | do | A |
| 41 | do | 50 | 150 | C | do | A |
| 42 | do | 60 | 255 | B | do | A |
| 43 | Acrylic acid<br>N,N'-methylene-bis-acrylamide | 25<br>13 | 195 | B | Translucent | A |
| 44 | Acrylic acid<br>Acrylamide | 25<br>25 | 300 | B | do | A |
| 45 | Acrylic acid<br>N-dimethylacrylamide | 15<br>45 | 430 | B | do | A |
| 46 | Acrylic acid<br>Styrene | 25<br>13 | 120 | C | Transparent | A |
| 47 | Acrylic acid<br>Diallylphthalate | 25<br>25 | 140 | C | do | A |
| 48 | Acrylic acid<br>Vinyltoluene | 6<br>54 | 110 | C | do | B |
| 49 | Acrylic acid<br>Methylacrylate | 25<br>13 | 120 | E | do | A |
| 50 | Acrylic acid<br>Butylacrylate | 25<br>25 | 120 | E | Translucent | A |
| 51 | Acrylic acid<br>Tetraethylene glycol diacrylate | 6<br>54 | 110 | D | do | B |
| 52 | Acrylic acid<br>Methylmethacrylate | 25<br>25 | 165 | D | do | B |
| 53 | Acrylic acid<br>2-hydroxypropyl methacrylate | 25<br>25 | 125 | D | do | B |
| 54 | Acrylic acid<br>2-ethylhexylacrylate | 25<br>25 | 110 | D | do | A |
| 55 | Acrylic acid<br>Vinyl acetate | 25<br>25 | 35 | A | do | C |
| 56 | Acrylic acid<br>N-vinylpyrolidone | 25<br>25 | 15 | A | Discolored | D |
| 57 | Acrylic acid<br>Acrylonitrile | 25<br>25 | 40 | B | Opaque | C |
| 58 | Acrylic acid<br>Methylvinyl ketone | 25<br>25 | 45 | A | Translucent | C |
| 59 | Acrylic acid<br>Ethylvinyl ether | 25<br>25 | 15 | A | do | D |
| 60 | Acrylic acid<br>Methyl maleate | 25<br>25 | 70 | A | do | C |
| 61 | Acrylic acid<br>Allyl alcohol | 25<br>25 | 35 | A | do | C |
| 62 | Acrylic acid<br>4-vinylpyridine | 25<br>25 | 20 | A | Discolored | D |
| 63 | Acrylic acid<br>1-hexene | 25<br>25 | 15 | A | Opaque | D |

NOTE.—Conditions of measurements:

[1] Tensile strength: The same as in Examples 2-13.
[2] Elongation: The same as in Examples 2-13.
[3] Transparency: The same as in Examples 14-38.
[4] Gell up time: The same as in Examples 14-38.

EXAMPLES 64-72

0.25 mole of polyoxytetramethylene glycol having an average molecular weight of 300, 0.25 mole of bishydroxyethylphthalate, 0.09 mole of maleic acid and 0.41 mole of succinic acid were polycondensed in the same manner as in example 1 to produce an unsaturated polyester having an average molecular weight of 10,000 and a double bond concentration of $5\times10^{-4}$ mol/g. To 100 parts of the unsaturated polyester thus obtained, there were added a desired amount of acrylic acid, a desired amount of a variety of ethylenically unsaturated compounds shown in table IV and 2 parts of benzoin to produce photosensitive compositions. Each resulting composition was exposed for 20 minutes to 60 fluorescent lamps at a distance of 10 cm. and then a tensile strength, an elongation, a transparency and a water absorption were measured. The results are shown in table IV.

TABLE IV

| Example Number | Ethylenically unsaturated compound | (Parts by weight) | Tensile strength [1] (kg./cm.²) | Elongation [2] | Transparency [3] | Water absorption [4] |
|---|---|---|---|---|---|---|
| 64 | Acrylic acid | 25 | 350 | C | Transparent | 0.6 |
| | Acrylamide | 25 | | | | |
| | Styrene | 25 | | | | |
| 65 | Acrylic acid | 20 | 345 | C | do | 0.8 |
| | Acrylamide | 20 | | | | |
| | Diallylphthalate | 40 | | | | |
| 66 | Acrylic acid | 10 | 200 | C | do | 1.2 |
| | Acrylamide | 10 | | | | |
| | Monoallylphthalate | 60 | | | | |
| 67 | Acrylic acid | 25 | 350 | D | Translucent | 2.1 |
| | N-methylolacrylamide | 25 | | | | |
| | Ethylacrylate | 25 | | | | |
| 68 | Acrylic acid | 20 | 325 | E | do | 1.5 |
| | N-methylolacrylamide | 20 | | | | |
| | Butylacrylate | 40 | | | | |
| 69 | Acrylic acid | 10 | 315 | D | do | 1.5 |
| | N-methylolacrylamide | 10 | | | | |
| | Pentlacrylate | 60 | | | | |
| 70 | Acrylic acid | 25 | 70 | B | Opaque | 2.7 |
| | Methacrylamide | 25 | | | | |
| | Vinylacetate | 25 | | | | |
| 71 | Acrylic acid | 25 | 95 | B | do | 2.5 |
| | Methacrylamide | 25 | | | | |
| | Acrylonitrile | 25 | | | | |
| 72 | Acrylic acid | 25 | 65 | A | Translucent | 3.2 |
| | Methacrylamide | 25 | | | | |
| | Ethylvinyl ketone | 25 | | | | |

NOTE.—Conditions of measurements:
[1] Tensile strength: the same as in Examples 2-13.
[2] Elongation: the same as in Examples 2-13.
[3] Transparency: the same as in Example 14-38.
[4] Water absorption: the same as in Example 14-38.

EXAMPLES 73-78

0.25 mole of trimethylolpropane monooleate, 0.25 mole of polyoxypropyleneglycol having an average molecular weight of 300, 0.11 mole of maleic anhydride and 0.39 mole of adipic acid were polycondensed in the same manner as in example 1 to produce an unsaturated polyester having an average molecular weight of 13,000 and a double bond concentration of $5\times10^{-4}$ mole/g. To 100 parts of the unsaturated polyester thus obtained, there were added a desired amount of acrylic acid, a desired amount of a variety of ethylenically unsaturated compounds shown in table V and 2 parts of benzoin to produce photosensitive compositions. Each resulting photosensitive composition was exposed for 10 minutes to a 3 kw. carbon arc lamp at a distance of 80 cm. and then a tensile strength, an elongation and a transparency were measured. The results are shown in table V.

TABLE V

| Example Number | Ethylenically unsaturated compound | (Parts by weight) | Tensile strength [1] (kg./cm.²) | Elongation [2] | Transparency [3] |
|---|---|---|---|---|---|
| 73 | Acrylic acid | 25 | 240 | D | Transparency. |
| | Styrene | 25 | | | |
| | Methylmethacrylate | 25 | | | |
| 74 | Acrylic acid | 20 | 225 | E | Do. |
| | Styrene | 20 | | | |
| | Methylacrylate | 40 | | | |
| 75 | Acrylic acid | 10 | 215 | D | Do. |
| | Diallylphthalate | 10 | | | |
| | Dioxyethyleneglycol monoacrylate. | 60 | | | |
| 76 | Acrylic acid | 25 | 45 | A | Do. |
| | Styrene | 25 | | | |
| | Vinyl acetate | 25 | | | |
| 77 | Acrylic acid | 25 | 55 | B | Do. |
| | Diallylphthalate | 25 | | | |
| | Methylvinyl ketone | 25 | | | |
| 78 | Acrylic acid | 25 | 40 | A | Discolored. |
| | Styrene | 25 | | | |
| | 4-vinylpyridine | 25 | | | |

NOTE.—Conditions of measurements:
[1] Tensile strength: the same as in Examples 2-13.
[2] Elongation: the same as in Examples 2-13.
[3] Transparency: the same as in Examples 14-38.

EXAMPLES 79-86

0.250 mole of propyleneglycol, 0.250 mole of polytetramethylene glycol having an average molecular weight of 300, 0.068 mole of itaconic acid and 0.432 mole of succinic acid were polycondensed in the same manner as in example 1 to produce an unsaturated polyester having an average molecular weight of 9,000 and a double bond concentration of $5\times10^{-4}$ mole/g. To 100 parts of the unsaturated polyester thus obtained, there were added a desired amount of acrylic acid and acrylamide, a desired amount of a variety of unsaturated compounds shown in table VI and 2 parts of benzoin to produce photosensitive compositions. Each resulting photosensitive composition was exposed for 10 minutes to a 3 kw. carbon arc lamp at a distance of 80 cm. and then a tensile strength, an elongation and a transparency were measured. The results are shown in table VI.

tightly fixed. The transparent glass side of the cell was firstly exposed for 2 minutes and secondly the negative side was exposed for 5 minutes to 60 w. fluorescent lamps for duplicate at a distance of 10 cm. The unexposed areas were removed by washing with a 5 percent aqueous ammonia solution to give a flexible halftone block of 1.5 mm. in total thickness consisting of a relief portion of 0.5 mm. in height and a photopolymerized supporting substrate layer of 1 mm. in height. The four color work was run by using the halftone block to give clear four color prints having a good dimensional stability.

TABLE VI

| Example Number | Ethylenically unsaturated compound | (Parts by weight) | Tensile strength [1] (kg./cm.$^2$) | Elongation [2] | Transparency [3] |
|---|---|---|---|---|---|
| 79 | Acrylic acid | 17 | 330 | E | Transparent. |
| | Acrylamide | 17 | | | |
| | Styrene | 17 | | | |
| | Methylacrylate | 25 | | | |
| 80 | Acrylic acid | 9 | 280 | E | Do. |
| | Acrylamide | 9 | | | |
| | Styrene | 9 | | | |
| | Methylacrylate | 50 | | | |
| 81 | Acrylic acid | 17 | 360 | D | Do. |
| | Acrylamide | 17 | | | |
| | Styrene | 17 | | | |
| | Methyl methacrylate | 25 | | | |
| 82 | Acrylic acid | 17 | 340 | D | Do. |
| | Acrylamide | 17 | | | |
| | Diallylphthalate | 17 | | | |
| | 2-hydroxypropylmethacrylate. | 25 | | | |
| 83 | Acrylic acid | 17 | 300 | E | Do. |
| | Acrylamide | 17 | | | |
| | Styrene | 17 | | | |
| | Butylacrylate | 25 | | | |
| 84 | Acrylic acid | 17 | 320 | D | Do. |
| | Acrylamide | 17 | | | |
| | Diallylphthalate | 17 | | | |
| | Glycidylmethacrylate | 25 | | | |
| 85 | Acrylic acid | 17 | 90 | B | Do. |
| | Acrylamide | 17 | | | |
| | Styrene | 17 | | | |
| | Vinyl acetate | 25 | | | |
| 86 | Acrylic acid | 17 | 110 | B | Do. |
| | Acrylamide | 17 | | | |
| | Diallylphthalate | 17 | | | |
| | Acrylonitrile | 25 | | | |

NOTE.—Conditions of measurements:

[1] Tensile strength: the same as in Examples 2–13.

[2] Elongation: the same as in Examples 2–13.

[3] Transparency: the same as in Examples 14–38.

EXAMPLE 87

To 70 parts of the unsaturated polyester in example 14, there were added 10 parts of acrylic acid, 10 parts of acrylamide, 10 parts of styrene and 0.1 part of anthraquinone and these were thoroughly mixed to give a photosensitive composition. To a glass cell consisting of a spacer of 1.5 mm. in height forming four sides of the cell, a bottom plate of a transparent glass and a top plate of a transparent glass on which a facsimile negative for newspaper was tightly fixed, there was placed the aforesaid photosensitive composition. The negative side of the cell was firstly exposed for 5 minutes and secondly the transparent glass was exposed for 2 minutes to 60 w. fluorescent lamps for duplicate at a distance of 10 cm. Then the unexposed areas were removed by washing with a 0.3 percent aqueous sodium hydroxide solution to give a printing plate for newspaper having a sufficient flexibility and toughness. The printing plate thus obtained was fixed on the saddle of a rotary press and a rotary printing was run to give about 400,000 prints.

EXAMPLE 88

To 60 parts of the unsaturated polyester obtained in example 39, 10 parts of acrylic acid, 10 parts of styrene, 10 parts of butylacrylate and 1 part of benzoin methylether were added and these were thoroughly mixed to obtain a photosensitive composition. The resulting photosensitive composition was placed to a glass cell consisting of a rubber spacer of 1.5 mm. in height forming four sides of the cell, a bottom plate of a transparent glass and a top plate of a transparent glass on which a color separation negative of 175 lines per inch was

EXAMPLE 89

To 100 parts of the unsaturated polyester obtained in example 14, 40 parts of acrylic acid, 20 parts of styrene, 40 parts of methylacrylate, 4 parts of diphenyl disulfide and 0.2 parts of hydroquinone were added and these were thoroughly mixed to obtain a photosensitive composition. The resulting photosensitive composition was placed on a tin plate gained with sands of 300 mesh which four sides were surrounded with a spacer of 0.2 mm. in height. On the spacer a polyester film of 0.009 mm. in thickness was placed and a negative was tightly fixed on the polyester film. Then the negative side was exposed for 5 minutes to 60 w. fluorescent lamps at a distance of 5 cm. The unexposed areas were removed by washing with a 20 percent aqueous methanol solution to give a dry-offset printing plate. The resulting printing plate exhibited a sufficient printing resistance and a superior ink transference through a rotary printing.

EXAMPLE 90

To 100 parts of the unsaturated polyester obtained in example 73, 20 parts of acrylic acid, 20 parts of acrylamide, 10 parts of diallylphthalate, 10 parts of methyl methacrylate and 0.5 parts of benzophenone were added and these were thoroughly mixed to obtain a photosensitive composition. The resulting photosensitive composition was placed on a glass plate which four sides were surrounded with a rubber spacer of 2 mm. in height. On the spacer a transparent glass on which a polyester film carrying an image of a cartoon for POP advertisement was tightly fixed, was placed. The negative film side was exposed for 10 minutes to the light from a 3 kw. carbon arc lamp at a distance of 75 cm.

The unexposed areas were removed by washing with a 0.1 percent aqueous potassium hydroxide solution to give a cartoon article for POP advertisement of 2 mm. in thickness adhered to a glass plate. This article was dyed in a 2 percent Malachite Green (C.I. Basic Green VI: 42,000) dyeing bath for 10 minutes to give a beautiful glass display.

What is claimed is:

1. A photosensitive composition comprising (A) an unsaturated polyester, (B) a mixture of ethylenically unsaturated compounds (C) a photopolymerization initiator, said unsaturated polyester being produced from an alcoholic component comprising at least one diol having one to four ether-oxygen groups in the main chain and an acidic component comprising at least one unsaturated dicarboxylic acid, its anhydride or its methyl or ethyl ester and having an average molecular weight of 1,500 to 50,000 and a double bond concentration of $1\times10^{-2}$ to $2\times10^{-4}$ mole/g., said mixture (B) constituting 10 to 80 percent by weight of the photosensitive composition and the photopolymerization initiator constituting 0.001 to 10 percent by weight of the photosensitive composition, said mixture (B) comprising (i) at least 10 percent by weight of acrylic acid, (ii) up to 75 percent by weight of an amide of the formula

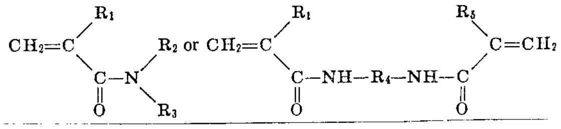

wherein $R_1$, $R_2$ and $R_5$ represent a hydrogen atom or methyl group; $R_3$ represents a hydrogen atom, $—C_mH_{2m+1}$ wherein $m$ is an integer from 1 to 6, a cyclohexyl group, $—(CH_2)_n—OH$ wherein $n$ is an integer from 1 to 5, $—(CH_2)_p—O—(CH_2)_q—CH_3$ wherein $p$ is an integer from 1 to 2 and $q$ is 0 or an integer from 1 to 5 or a $—CH_2—CH=CH_2$ group; $R_4$ represents $—(CH_2)_r—$ wherein $r$ is an integer from 1 to 10, (iii) up to 90 percent by weight of an aromatic vinyl compound having at least one

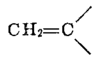

group and one benzene nucleus in the molecule, and (iv) up to 90 percent by weight of a compound of the formula

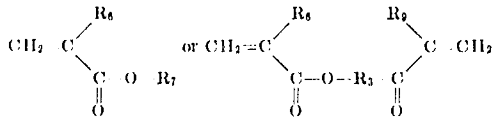

wherein $R_6$ and $R_9$ represent a hydrogen atom, a chlorine atom or methyl group; $R_7$ represents a hydrogen atom, $—C_m H_{2m+1}$ wherein $m$ is an integer from 1 to 15

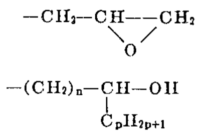

wherein $p$ is an integer from 1 to 2 and $m$ is an integer from 1 to 5,

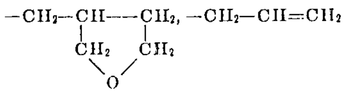

or $—(CH_2—CH_2—O)_q—H$ wherein $q$ is an integer from 1 to 15; and $R_8$ represents $—(CH_2—CH_2—O)_r—$ wherein $r$ is an integer from 1 to 15.

2. A photosensitive composition as claimed in claim 1 wherein the mixture (B) contains acrylamide.

3. A photosensitive composition as claimed in claim 1 wherein the mixture (B) contains styrene.

4. A photosensitive composition as claimed in claim 1 wherein the mixture (B) contains diallylphthalate.

5. A photosensitive composition as claimed in claim 1 wherein the mixture (B) contains methylacrylate.

6. A photosensitive composition as claimed in claim 1 wherein the mixture (B) contains butylacrylate.

7. A photosensitive composition as claimed in claim 1 wherein the mixture (B) contains styrene or diallylphthalate, and methyl or butylacrylate.

* * * * *

PO-1050
(5/69)

UNITED STATES PATENT OFFICE
CERTIFICATE OF CORRECTION

Patent No. 3,628,963 Dated December 21, 1971

Inventor(s) Kiyoshi Akamatsu et al.

It is certified that error appears in the above-identified patent and that said Letters Patent are hereby corrected as shown below:

Col. 1, line 14 - "an" should be --the--.

Col. 1, line 57 - delete last "4".

Col. 3, line 68 - "$-(CH_2)_q-CH_3$" should be $--(CH_2)_p-O-(CH_2)_q-CH_3--$.

Col. 5, line 22 - after "weight" insert --the--.

Signed and sealed this 6th day of June 1972.

(SEAL)
Attest:

EDWARD M.FLETCHER,JR.
Attesting Officer

ROBERT GOTTSCHALK
Commissioner of Patents